United States Patent [19]
Shaw

[11] Patent Number: 5,144,227
[45] Date of Patent: Sep. 1, 1992

[54] DIGITAL HIGH-VOLTAGE METER FOR DETECTING A LOAD TO SOURCE VOLTAGE AND A NEUTRAL POSITION OF A UTILITY VOLTAGE REGULATOR

[75] Inventor: Lewis A. Shaw, Hastings, Mich.

[73] Assignee: Hastings Fiber Glass Products, Inc., Hastings, Mich.

[21] Appl. No.: 758,788

[22] Filed: Sep. 12, 1991

Related U.S. Application Data

[63] Continuation-in-part of Ser. No. 609,375, Nov. 5, 1990, abandoned.

[51] Int. Cl.⁵ .............................................. G01R 1/06
[52] U.S. Cl. ................................. 324/149; 324/158 P
[58] Field of Search ............... 324/140 R, 140 D, 141, 324/149, 158 P, 72, 72.5, 98, 99 D, 101

[56] References Cited

U.S. PATENT DOCUMENTS 3,193,765  7/1965  Bevins .................................. 324/149

Primary Examiner—Walter E. Snow
Attorney, Agent, or Firm—Flynn, Thiel, Boutell & Tanis

[57] ABSTRACT

A regulator neutral detector comprises a pair of probes for engaging the source conductor and the load conductor, respectively, of an electrical utility voltage regulator and a digital voltmeter for indicating the difference between voltages applied to said probes.

26 Claims, 4 Drawing Sheets

DIGITAL HIGH-VOLTAGE METER FOR DETECTING A LOAD TO SOURCE VOLTAGE AND A NEUTRAL POSITION OF A UTILITY VOLTAGE REGULATOR

This application is a continuation-in-part of U.S. Ser. No. 07/609 375, filed Nov. 5, 1990, now abandoned.

FIELD OF THE INVENTION

This invention relates to a device for detecting the neutral position of a voltage regulator on a high-voltage, electrical utility distribution line or the like. The voltage regulator device is mountable on an electrical insulating pole, commonly referred to as a hot stick, for use by utility company linemen.

DESCRIPTION OF THE PRIOR ART

Voltage regulators are used by electrical utilities to adjust the line voltage at customers' terminals within selected limits. The regulators can be located in a substation or be mounted on a power pole in a distribution line. The power flowing down the line passes through the regulator which automatically adjusts the output voltage. The regulator must be taken out of service from time to time so that maintenance operations can be performed. It is undesirable to deenergize the entire distribution line and, therefore, bypass switches are provided to permit the regulator to be bypassed so that the utility can continuously provide its customers with power, even though the power is less regulated when the regulator is bypassed.

The operational steps involved in taking a regulator out of service are:

(1) switching the regulator to neutral position in which there is no voltage transformation between the source and load conductors, (2) then closing a switch in a bypass line that is connected in parallel with the regulator, and (3) then opening the switches that connect the regulator in the distribution line.

Step (1) (placing the regulator in neutral) is a very important step. If the regulator is not in neutral when step (2) is performed, the regulator will operate to add voltage or to subtract voltage from the system voltage. This has the same effect as if some of the coils and the regulator's series windings have been shorted out. The regulator may explode when this condition exists.

It is conventional to provide two neutral indicators on voltage regulators, namely, a mechanical dial at the top of the regulator and a light on a control panel. Even so, many electrical utilities want to have available an additional method of verifying the neutral position of the regulator. There may be situations in which the two neutral indicators on the regulator do not provide the same indication, because of some malfunction or discrepancy. Most utilities require two indications of the neutral position prior to switchings (steps 2 and 3, above). Thus, if the two neutral indicators on the regulator do not provide the same indication, the entire distribution line must be deenergized, then the switchings (steps 2 and 3, above) are performed and then the distribution line is reenergized. This procedure is not acceptable because of customer dissatisfaction and loss of income to the utility.

As indicated above, in the neutral position of the regulator, the voltage coming into the regulator (the source side) and the voltage leaving the regulator (the load side) is the same, but both may be as high as about 19,950 volts. Moreover, distribution system voltage regulators conventionally adjust the load voltage in steps of about ⅝% (0.00625) of the source voltage. It is desired to provide a regulator neutral detector which determines whether or not the regulator is in neutral and, if it is not in neutral, how many adjustment steps will be necessary to reach neutral.

SUMMARY OF THE INVENTION

According to the invention, there is provided a device for indicating the approximate difference between the source and load voltages of an electrical utility voltage regulator and detecting the neutral position of the regulator, which device comprises a pair of elongated, electrically conductive probes or electrodes which are adapted to contact the source and load conductors, respectively, of the regulator. Each probe has a high-voltage resistor means connected in series therewith. The resistor means associated with each of the probes is encapsulated in an electrical insulating material. The resistor means is adapted to provide a relatively low amperage A.C. output signal which is indicative of the voltage applied on its associated probe. A casing or housing is provided on the regulator neutral detector device. The casing contains a circuit board providing a digital voltmeter and a battery for powering the voltmeter. The digital voltmeter has a pair of input terminals which are respectively connected to the resistor means associated with the respective probes. Separate conductors connect the resistor means for the respective probes to the respective input terminals of the digital voltmeter. Thus, A.C. signals are supplied to the respective input terminals of a digital voltmeter when the probes contact the source and load conductors so that the difference between the source and load voltages is established. The digital voltmeter comprises filter means for filtering out selected high frequency range and low frequency range components of the resultant A.C. signal. A.C. amplifier means is provided for amplifying the filtered A.C. signal. Rectifying means is provided for rectifying the filtered A.C. signal. A digital meter is connected for receiving the rectified signal and providing a visible, digital, readout indicative of the difference of the A.C. voltages sensed by the probes.

The invention also provides an improved method for detecting the neutral position of an electrical utility voltage regulator which comprises placing the two probes of a regulator neutral detector in contact with the source conductor and the load conductor of the regulator; separately generating, through respective high-voltage resistor means connected to the probes, low amperage A.C. signals indicative of the voltages on the source and load conductors, feeding the signals to a digital voltmeter effective to generate a initial reading indicative of the difference between the voltages on the source and load conductors; adjusting the regulator to change the difference between the voltages on the source and load conductors; then repeating the steps of placing the probes, generating the signals and adjusting the regulator until the lowest readout is provided on said digital voltmeter.

DESCRIPTION OF THE PREFERRED EMBODIMENT

Figure 1:
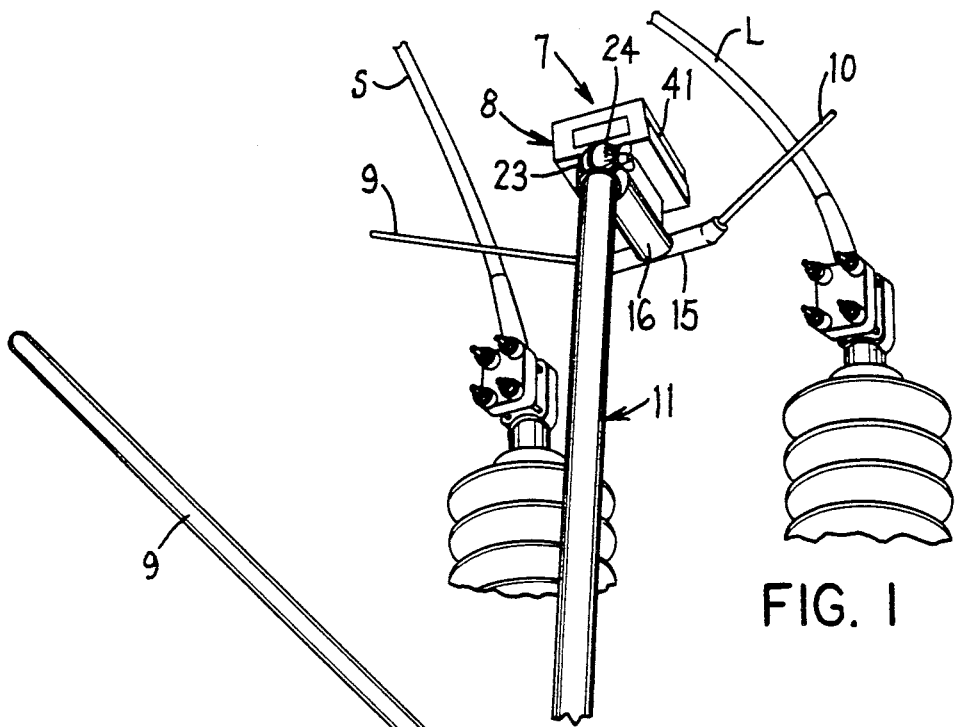
FIG. 1 is a perspective view of a regulator neutral detector according to the present invention.

The regulator neutral device 7, according to the present invention is comprised of an elongated casing or housing 8 having two probes or electrodes 9 and 10 projecting therefrom and arranged so that they can simultaneously contact the source conductor S and the load conductor L of the voltage regulator, respectively (see FIG. 1). The probes 9 and 10 preferably extend at corresponding angles of, for example, about 45°, relative to the longitudinal axis of the housing 8 so that the probes have a substantially truncated V-shaped configuration. The two probes 9 and 10 are made of electrical conductive material, for example, stainless steel. The housing 8 is positioned between the probes 9 and 10 for easy viewing of the digital readout, as described below, and to minimize the size of the regulator neutral detector. The probes 9 and 10 are mounted on an elongated, electrically insulating, connector head 15, which in turn is mounted on one end of an electrically insulating support tube 16. The support tube 16 in turn can be mounted on an elongated, electrically insulating hot stick 11 (FIG. 1) so that the electrical utility lineman can place the probes 9 and 10 on load and source conductors which may be located many feet above the ground. The hot stick 11 can be of any suitable type and forms no part of the present invention. An example of a suitable hot stick is disclosed in U.S. Pat. No. 4 069 978.

The housing 8 contains a circuit board 46 which incorporates the electrical circuit elements of a digital voltmeter, as further described hereinbelow.

Figure 2:
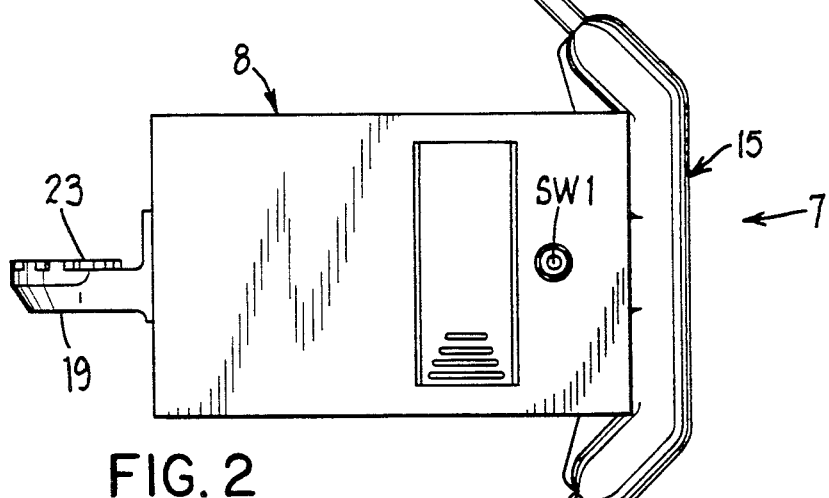
FIG. 2 is a top plan view of the regulator neutral detector.
Figure 3:
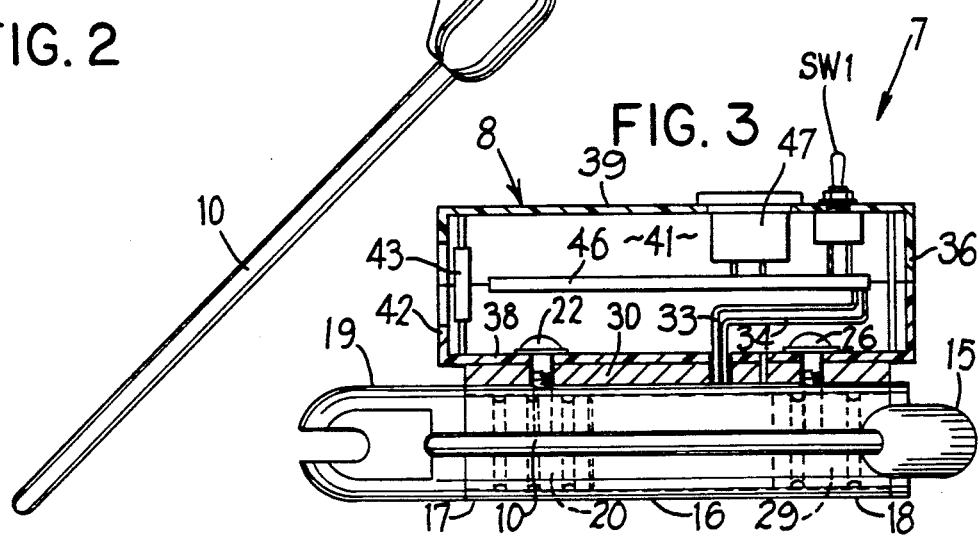
FIG. 3 is a side view, partially broken-away, of the regulator neutral detector.

Referring to FIG. 3, the support tube 16 has an inner end 17 and an outer end 18. An electrically conductive, universal mounting fitting 19 is mounted on the inner end 17 of the tube 16. The fitting 19 comprises a post 20 which is slidably received in the inner end of the tube 16 and is secured therein by an epoxy adhesive. A screw 22 is provided to secure the housing 8 to the tube 16 and to provide electrical contact between the housing 8 and fitting 19. The fitting 19 has an adaptor section 23 (FIG. 2) which is adapted to be coupled to a universal head 24 mounted on the end of the hot stick 11 in a conventional manner so that the tube 16 can be removably disposed at a selectable angle relative to the longitudinal axis of the hot stick 11 and can be releasably clamped in such adjusted position.

The electrically conductive connector head 15 has a post 29 (FIGS. 3 and 4) which is slidably received in the outer end 18 of the tube 16 and is releasably secured therein by an epoxy adhesive. A screw 26 is provided to secure the housing 8 to the outer end of the tube 16. A spacer 30 is provided between the casing 8 and the tube 16 to facilitate mounting of the casing 8 on tube 16.

Figure 4:
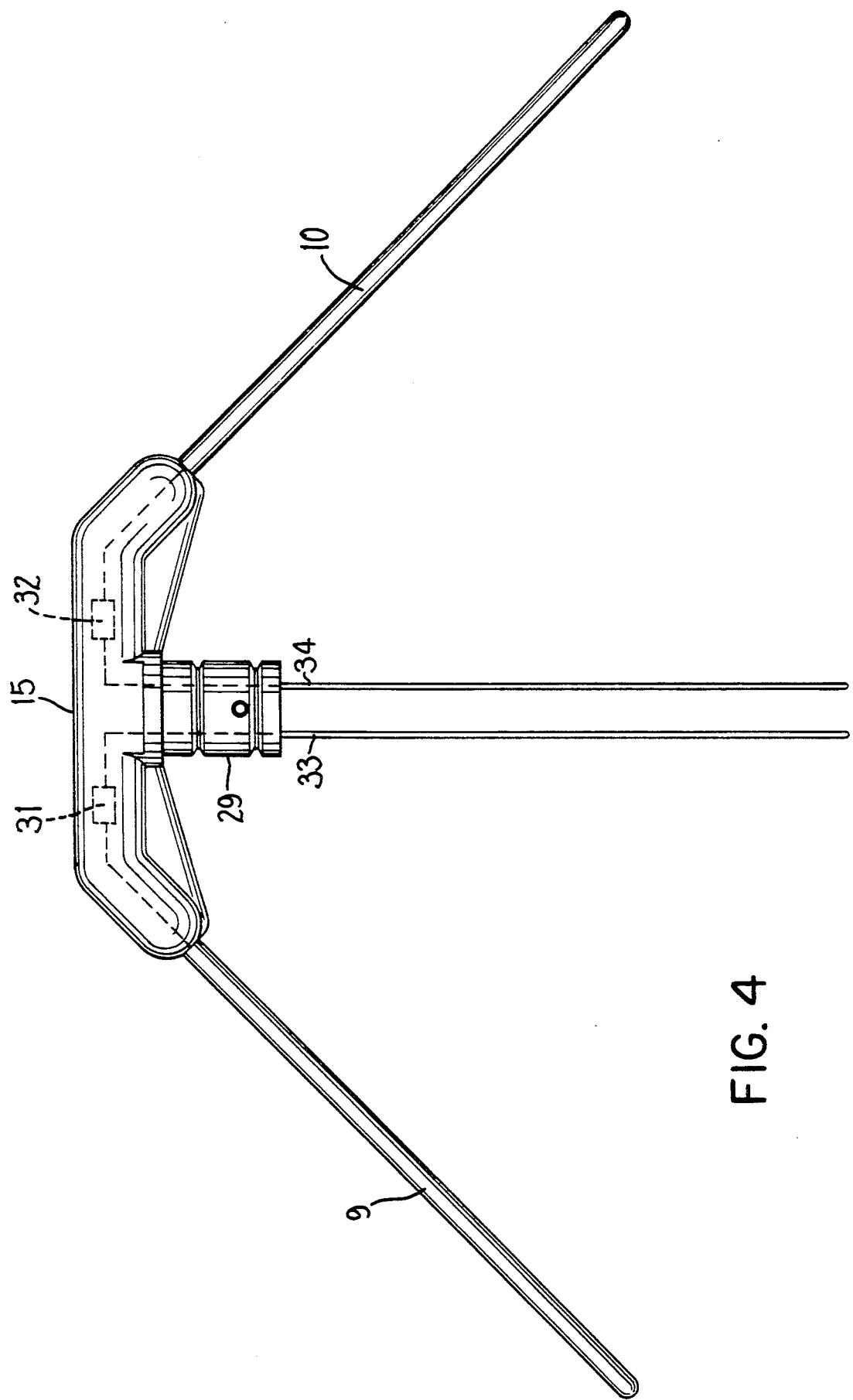
FIG. 4 is a top plan view of the detector head.
Figure 5:
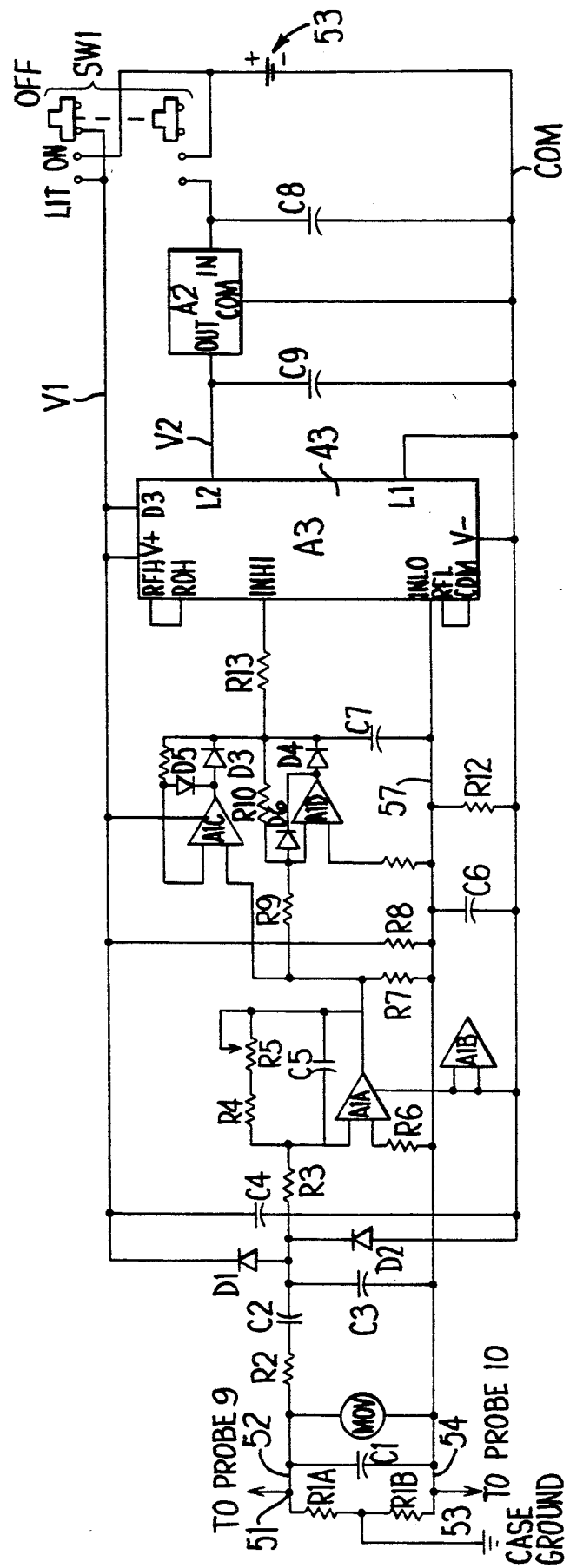
FIG. 5 is a circuit diagram of the digital voltmeter of the regulator neutral detector.

The probes 9 and 10 are here illustrated as being straight electrodes but it will be understood that the probes 9 and 10 can be of any suitable desired shape, as the need dictates. Referring to FIG. 4, the probes 9 and 10 are electrically connected to encapsulated, high-voltage, resistors 31 and 32, respectively. The resistors 31 and 32 are encapsulated inside the connector head 15.

The outer ends of the resistors 31 and 32 are connected to the respective probes 9 and 10 and the inner ends of the resistors are connected to the conductors 33 and 34, respectively. The conductors 33 and 34 are electrically insulated from each other and they are adapted to be secured to the printed circuit board 46 to provide separate electrical inputs to the voltmeter circuit, as will be described hereinbelow. The resistors 31 and 32 are rated for the maximum voltage difference that should appear in the regulator at the most extreme adjustment, for example, they should be rated for a voltage of 2,000 volts when used on a 20 kV regulator.

The housing 8 is of generally rectangular, box-like configuration and is comprised of an outer end wall 36, a base wall 38, a top wall 39 and a pair of side walls 41. The inner end wall of the housing 8 is defined by an end panel 42 on which there is mounted a digital readout device 43. In the illustrated embodiment, the digital readout device 43 is a window-mounted, digital meter, such as a Modutec model BL 300102-01 DPM, with a five-volt backlight and a nine-volt D.C. meter supply. The window-mounted, digital meter 43 is commercially available from Modutec Incorporated of Norwalk, Conn. The invention is not limited, however, to the specific digital meter identified above.

The housing 8 is made of electrical insulating, moldable, synthetic resin. An electrically conductive shield coating is applied to the inner surface of the housing 8 in order to prevent the digital meter from being exposed to high electrical field gradients. The electrically conductive shield coating on the housing 8 is electrically connected to the printed circuit board 46.

The printed circuit board 46 is mounted inside the housing 8. A battery 53, such as a conventional nine-volt battery is removably mounted in a battery holder 47 for powering the electrical components of the digital voltmeter. A power switch SW1 is provided for starting operation of the voltmeter. The power switch SW1 is a two-pole, three-position toggle switch. The three positions of the switch SW1 are "OFF", "ON" and "LIT". The "LIT" position signifies that the circuit is "on" and that the backlight of the meter element is lit. The "ON" position signifies that the circuit is "on" and that the backlight of the meter element is not lit. The "OFF" position signifies that the circuit is "off" and that the backlight of the meter element is not lit. When the power switch SW1 is in "ON" position, the battery plus terminal is connected to conductor V1. When the power switch SW1 is in the "LIT" position, the battery plus terminal is connected to conductor V1 and to the voltage regulator chip A2. The voltage regulator chip A2 provides a suitable voltage on conductor V2, such as about five volts, for operating the backlight of the meter 43. Thus, in a typical embodiment of the invention, the conductor V1 will carry nine volts when the power switch SW1is in either the "ON" position or the "LIT" position, and conductor V2 will carry about five volts when the power switch SW1 is in the "LIT" position.

The probe 9 is connected to a terminal 51 of a conductor 52 and the probe 10 is connected to a terminal 53 of a conductor 54 in order to provide input A.C. signals to the electrical circuit of the regulator neutral device 7. A pair of series-connected matched input load resistors R1A and R1B, and an input capacitor C1, are connected between the conductors 52 and 54 whereby to provide a voltage drop of a selected value across their connection. For example, resistors R1A and R1B, and capacitor C1 may provide a voltage drop of slightly less than 2.000 volts RMS across their connection when one milliamp A.C. is applied through them. The conductors 33, 34 are connected to the circuit board 46 to supply thereto two separate inputs at 51 and 53 which are indicative of the voltages on the probes 9 and 10. A junction between the resistors R1A and R1B is connected to housing ground.

The charging current into the shield coating on the inner surface of the housing 8 will cause an error in the signal being measured. To minimize this charging error two matched resistors R1A and R1B are provided and the casing ground is connected between them. The voltage drop across the two resistors will be increased by the amount of charging current flowing in R1A and will be decreased by the amount of charging current flowing in R1B. Since these currents are very nearly equal, the additive error will be offset by the subtractive error. A minor error may still exist but it will be less than 1 volt so that it can be ignored.

A voltage spike suppressor MOV can be provided across the conductors 52 and 54 to provide the capability of withstanding large surges of voltage. The voltage spike compressor MOV can be omitted if it is likely that the instrument may be subjected to large surges, such as caused by an arc-over, that will destroy the instrument anyway.

Resistor R2 and capacitor C3 provide a first filter against the passage of high frequency signals. It may be desired to cut off signals above about 300 Hz which is the sixth harmonic of the power line. Further, diodes D1 and D2 clamp the input voltage and R2 provides a blocking action. The voltage is clamped at the position of resistor R2 and capacitor C3 so that a clamped signal is supplied to the terminals of the first stage amplifier A1A. This prevents any input signals from exceeding the supply voltage range of the first stage amplifier A1A.

Capacitor C2 serves as a D.C. blocking capacitor. If capacitor C2 were not provided, it is possible that some amount of D.C. current, sufficient to make the meter reading inaccurate, would take place because of anomalies in the resistances of the conductors, such as oxide films on the wires, so that some rectification might take place. Also, capacitor C2 in combination with the net input resistance of the first-stage amplifier A1A provides a low pass cutoff of 12 Hz to eliminate signals of 12 Hz or less, that might otherwise be passed and measured.

The amplifier sections A1A, A1B, A1C and A1D are provided by an integrated circuit chip, commonly known as a quad operational amplifier. One typical and acceptable example of a quad operational amplifier is Precision Monolithics Inc. OP490EY Quad OP-AMP Chip. The amplifier section A1B is tied off and is nonfunctional. The amplifier section A1A, in combination with resistance R4 and variable resistance R5, the net input resistance of resistances R2 and R3 and the capacitor C5 provides an additional filter against high frequency signals, such as 300 HZ or higher, and isolates the input resistors R1A and R1B from the metering circuits to be described below. In the illustrated example, when the voltage drop across R1A, R1B, C1 is 2 V RMS, the output of amplifier A1A is approximately 1 V RMS. A gain adjustment of, for example, plus or minus 15%, can be achieved by adjustment of the variable resistance R5.

Amplifier section A1C rectifies the positive half of the A.C. signal at the output terminal of amplifier section A1A. When the input voltage to amplifier section A1C is higher than the stored D.C. output voltage in output filter capacitor C7, it provides charging current to the output filter capacitor C7 via diode D3. Diode D5 is a feedback component for increasing the speed and accuracy of the amplifier.

Amplifier section A1D rectifies the negative half of the A.C. signal at the output terminal of amplifier section A1A. This is done by the inverting action of amplifier section A1D in combination with the resistances R9 and R10. When the output voltage to amplifier A1D exceeds the voltage stored in capacitor C7, it provides charging current to the output capacitor C7, via diode D4. Diode D6 is a feedback component for increasing the speed and accuracy of the amplifier.

Capacitor C7 filters any pulses generated by the two amplifier sections A1C and A1D so that the resulting A.C. voltage on the capacitor C7 is less than 4% of the D.C. voltage output.

The resistances R8 and R12 divide the battery voltage applied to conductors V1 and COM so that a reference voltage is present on conductor 57, which reference voltage acts as a synthetic ground for amplification, filtering and rectification. Capacitor C6 has a low impedance at 60 Hz compared to the resistors and provides a low impedance path for A.C. currents that exist in the circuit.

A net D.C. signal, for example, approximately 1.414 V D.C., is produced across capacitor C7. An input signal is supplied through resistor R13 to the meter element A3. The Modutec BL 300102-01 meter element, identified as A3, is specified as one having a range of 0 to 1.999 V D.C. input, operating from a supply of 9 V D.C. and having a backlight using 5 V D.C. The signal from capacitor C7 is supplied to the "INHI" terminal of the meter element A3. The necessary backlight voltage is supplied to terminal L2 of the meter element A3 from the voltage regulator A2. Because the backlight draws a considerable amount of current, in order to avoid excessively rapid draining of the battery 53, it will be possible for the user to elect to use the meter only. The Modutec meter element A3 has the capability of sensing low battery voltage and displaying this by means of a visible message so that the user can take appropriate steps to replace the battery when needed.

In use, the user will switch on the electrical circuit by means of the switch SW1, extend the two probes 9 and 10 and attach them separately to the source conductor S and load conductor L. The user can then observe the voltage difference between the two conductors on the digital meter 43.

The circuit includes filtering means, including resistance R2 and capacitor C3, against high frequency voltage so that arcing and sparking which may occur when the probes are attached to the high-voltage lines, will not cause damage to the meter circuit. Also, the meter circuit is protected against high-voltage surges.

The regulator neutral detector 7 is used to test the voltage difference between the source and load conductors only Therefore the probes 9 and 10 should not be contacted with different conductors.

The device 7 will determine the voltage difference between the load and the source, but it will not indicate whether the load voltage is higher or lower than the source voltage. After the lineman makes the initial voltage difference reading, the regulator should be stepped once in the direction that the lineman thinks is toward neutral, based on the position of the regulator indicator and the lineman's knowledge of the system. A second voltage difference reading is then taken. If this reading is lower than the first, the direction taken for stepping the regulator was correct. The difference between the first and second readings is the amount of regulation (voltage change) available in each step. Using conventional charts that show the voltage steps of regulators, the number of steps required to reach the neutral position can be determined. The regulator can then be stepped the required number of times, while checking the voltage difference periodically, until neutral is reached. Contact resistance may prevent an actual zero reading at neutral position. If the regulator cannot be stepped to provide a near zero voltage reading, for example, less than 5 volts, this may indicate that the voltage regulator is not operating correctly, in which case the line should be deenergized before the regulator is bypassed. The regulator can then be disconnected for maintenance.

The regulator neutral detector 7, according to the invention, can be used to verify the readings of the regulator indicators or it can be used in place of the regulator indicators, should they be damaged. By using the regulator neutral detector, utility company linemen can switch regulators that would otherwise require the line to be deenergized.

The V-shape of the electrode assembly places the digital readout directly between the source and load conductors for ease of viewing and to keep the overall size as small as possible. The V-shape gives the electrodes a self-centering tendency and allows the unit to be used with conductor spacing in the range of 6 to 15 inches without adjustment.

Figure 6:
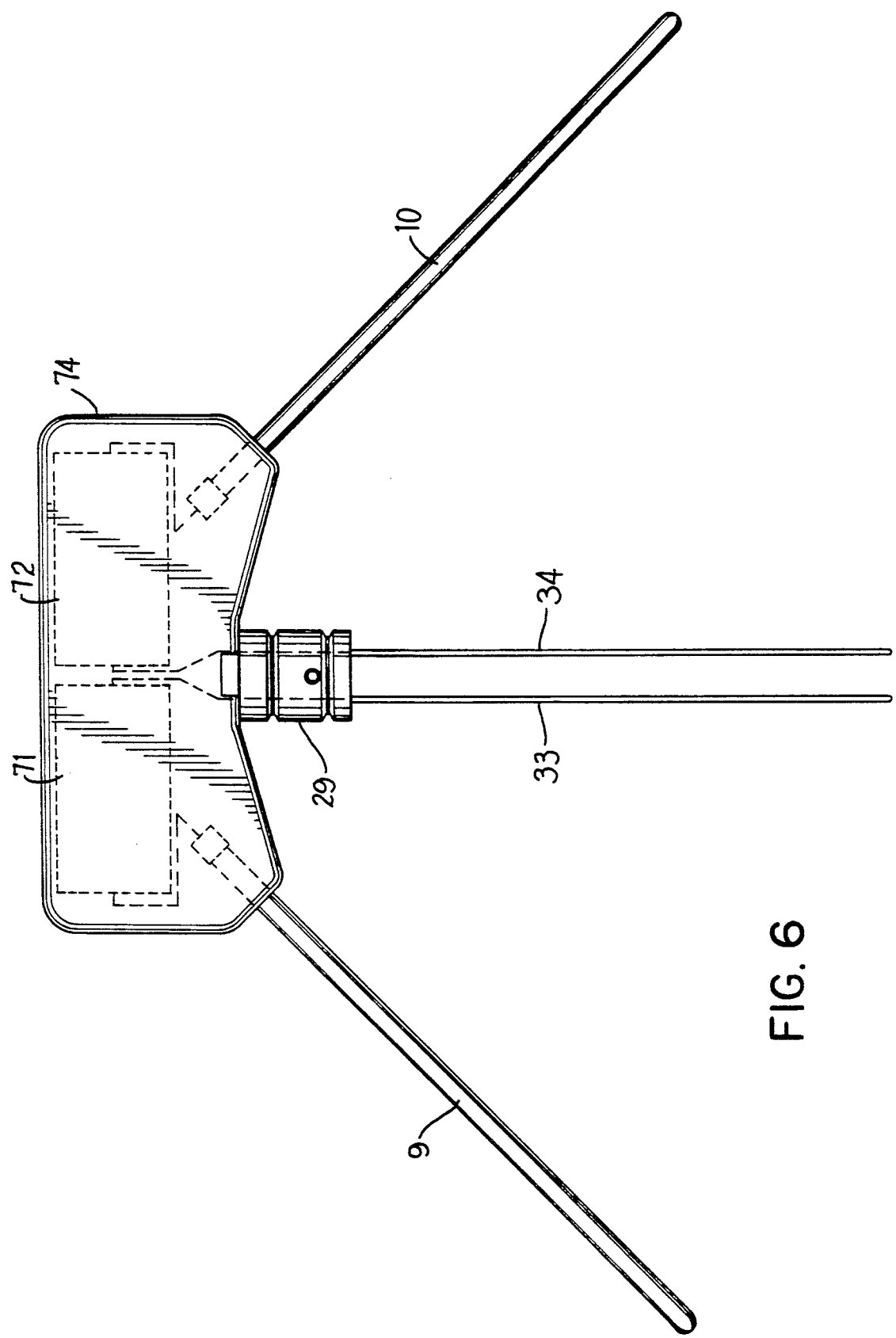
FIG. 6 is a view similar to FIG. 4 but showing an alternative embodiment.

FIG. 6 shows an alternative embodiment. Parts which are identical to those of the above-described embodiment are identified with the same reference numerals, and only the differences are described in detail below. More specifically, the resistors 31 and 32 shown in FIG. 4 have each been replaced with a respective capacitor 71 and 72, and the connector head 15 of FIG. 4 has been replaced with a new connector head 74 of larger size in order to accommodate the capacitors 71 and 72, which are larger than the resistors 31 and 32. The embodiment of FIG. 6 functions substantially identically to the embodiment of FIG. 4, except that the maximum voltage withstand value is 20,000 volts rather than 2,000 volts, thereby providing a larger margin of safety in the event a user happens to inadvertently misuse the device and apply an excessive voltage across the probes 9 and 10. Each of the capacitors 71 and 72 has the equivalent impedance of a 1M ohm resistor and the capability to withstand 10 K volts, which is achieved with a capacitance value of $0.002652\mu F$. Suitable capacitors are manufactured by Pacific Capacitor Co. of San Jose, Calif. as Part No. SM103G262A, which in turn are sold by Plastic Capacitors, Inc. of Chicago, Ill. as Part No. GR-150-262A.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A device for indicating the difference between the source voltage and the load voltage of an electrical utility voltage regulator and detecting the neutral position of the regulator, comprising: a casing; a pair of elongated, electrically conductive probes mounted on said casing and adapted to contact the source and load conductors of the regulator; a pair of high-voltage resistor means each connected in series with one of said probes, said resistor means being encapsulated in an electrical insulating material; a battery-powered digital voltmeter in said casing, said voltmeter having a pair of input terminals each connected in series with one of said resistor means so that a pair of A.C. signals are supplied to said voltmeter when said probes contact the source and load conductors; means for providing a resultant A.C. signal indicative of said difference; means for converting said resultant A.C. signal to a D.C. signal; and support means connected to said casing and having a fixture for releasably connecting said casing to an elongated, electrically insulating hot stick.

2. A device as claimed in claim 1 in which said probes are elongated electrodes which extend in opposite lateral directions from said casing.

3. A device as claimed in claim 1 in which said probes are arranged in substantially a V-shape with the adjacent ends of the probes being joined together by a connector head which is mounted on one end of said casing, said casing having a digital display on the opposite end thereof.

4. A device as claimed in claim 1 in which said digital voltmeter comprises filter means for filtering out selected high frequency range and low frequency range of said resultant A.C. signal, A.C. amplifier means for amplifying said resultant A.C. signal, rectifier means for rectifying said resultant A.C. signal and a digital meter connected for receiving the rectified signal and providing a visible digital readout indicative of the voltage difference between the voltages sensed by said probes.

5. A device as claimed in claim 4 in which said digital meter includes means for backlighting the digital readout and including a switch for selectively operating said backlighting means.

6. A device as claimed in claim 5 including voltage regulating means connected to said battery and adapted for supplying a reduced voltage for operating said backlighting means, said switch having a first operation position in which it supplies full battery voltage for providing the digital readout and does not supply said reduced voltage for operating said backlighting means and a second operating position in which it supplies full battery voltage for providing the digital readout and supplies said reduced voltage for operating said backlighting means.

7. A device as claimed in claim 4 in which said amplifier means and said rectifier means are separate stages of monolithic, integrated circuit, operational amplifier chip.

8. A device as claimed in claim 1 in which said voltmeter is provided by a circuit board in said casing and said casing has an electrically conductive coating on its inner surface and said coating is electrically connected to said circuit board.

9. A device as claimed in claim 1 in which said support means is a hollow tube having said fixture at one end thereof.

10. A method for detecting the neutral position of an electrical utility voltage regulator having a source conductor and a load conductor, which comprises the steps of: placing two probes of a regulator neutral detector in contact with the source conductor and the load conductor, respectively; separately generating, through high-voltage resistance means respectively connected to said probes, low amperage A.C. signals indicative of the voltages on said conductors; feeding said signals to a digital voltmeter to generate an initial reading indicative of the difference between the voltages on said conductors; adjusting the regulator to change the difference between the voltages on said conductors and then repeating said steps of placing said probes and generating said signals and then again adjusting the regulator until the lowest reading is provided on said voltage regulator.

11. A device for indicating the difference between the source voltage and the load voltage of an electrical utility voltage regulator and detecting the neutral position of the regulator, comprising: a casing; a pair of elongated, electrically conductive probes mounted on said casing and adapted to contact the source and load conductors of the regulator; a pair of high-voltage capacitor means each connected in series with one of said probes, said capacitor means being encapsulated in an electrical insulating material; a battery-powered digital voltmeter in said casing, said voltmeter having a pair of input terminals each connected in series with one of said capacitor means so that a pair of A.C. signals are supplied to said voltmeter when said probes contact the source and load conductors; means for providing a resultant A.C. signal indicative of said difference; means for converting said resultant A.C. signal to a D.C. signal; and support means connected to said casing and having a fixture for releasably connecting said casing to an elongated, electrically insulating hot stick.

12. A device as claimed in claim 11, in which said probes are elongated electrodes which extend in opposite lateral directions from said casing.

13. A device as claimed in claim 11, in which said probes are arranged in substantially a V-shape with the adjacent ends of the probes being joined together by a connector head which is mounted on one end of said casing, said casing having a digital display on the opposite end thereof.

14. A device as claimed in claim 11, in which said digital voltmeter comprises filter means for filtering out selected high frequency and low frequency components of said resultant A.C. signal, A.C. amplifier means for amplifying said resultant A.C. signal, rectifier means for rectifying said resultant A.C. signal and a digital meter connected for receiving the rectified signal and providing a visible digital readout indicative of the voltage difference between the voltages sensed by said probes.

15. A device as claimed in claim 14, in which said digital meter includes means for backlighting the digital readout and a switch for selectively operating said backlighting means.

16. A device as claimed in claim 15, including voltage regulating means connected to said battery and adapted for supplying a reduced voltage for operating said backlighting means, said switch having a first operational position in which it supplies full battery voltage for providing the digital read-out and does not supply said reduced voltage for operating said backlighting means and a second operational position in which it supplies full battery voltage for providing the digital readout and supplies said reduced voltage for operating said backlighting means.

17. A device as claimed in claim 14, in which said amplifier means and said rectifier means are separate stages of a monolithic, integrated circuit, operational amplifier chip.

18. A device as claimed in claim 11, in which said voltmeter includes a circuit board in said casing, said casing has an electrically conductive coating on its inner surface, and said coating is electrically connected to said circuit board.

19. A device as claimed in claim 11, in which said support means is ia hollow tube having said fixture at one end thereof.

20. A method for detecting the neutral position of an electrical utility voltage regulator having a source conductor and a load conductor, which comprises the steps of: placing two probes of a regulator neutral detector in contact with the source conductor and the load conductor, respectively; separately generating, through high-voltage capacitance means respectively connected to said probes, low amperage A.C. signals indicative of the voltages on said conductors; feeding said signals to a digital voltmeter to generate an initial reading indicative of the difference between the voltages on said conductors; adjusting the regulator to change the difference between the voltages on said conductors and then repeating said steps of placing said probes and generating said signals and then again adjusting the regulator until the lowest reading is provided on said voltage regulator.

21. A device for indicating the difference between the first and second voltages of an electrical utility voltage regulator, comprising: a casing; a pair of elongated, electrically conductive probes mounted on said casing and adapted to contact respective conductors of the regulator which respectively carry said first and second voltages; a battery-powered voltmeter in said casing, said voltmeter having a pair of input terminals; means coupling each of said probes to a respective one of said input terminals so that a pair of A.C. signals are supplied to said voltmeter when said probes contact said conductors; means for providing a resultant signal indicative of the difference between said first and second voltages; display means for providing a visual representation of said resultant signal; and support means for releasably connecting said casing to an elongated, electrically insulating hot stick.

22. A device as claimed in claim 21, wherein said means coupling said probes to said input terminals includes a pair of high-voltage resistor means each coupling a respective one of said probes to a respective one of said input terminals.

23. A device as claimed in claim 21, wherein said means coupling said probes to said input terminals includes a pair of high-voltage capacitor means each coupling a respective one of said probes to a respective one of said input terminals.

24. A device as claimed in claim 21, wherein said voltmeter is a digital voltmeter, wherein said display means includes a digital display, wherein said resultant signal is an A.C. signal, and including means for converting said resultant A.C. signal to a D.C. signal, said display means being responsive to said D.C. signal for providing said visual representation of the difference between said first and second voltages.

25. A portable device for measuring a voltage difference between respective points on utility power lines, comprising: an elongate pole made of an insulating material; first and second probes each adapted for engagement with a utility power line; a digital voltmeter circuit having first and second input terminals, having two circuit elements connected in series between said input terminals, and having means electrically coupling each of said input terminals to a respective one of said probes; digital display means coupled to said voltmeter circuit for providing a visible digital display of a voltage difference between said probes; an electrical shield disposed around said digital voltmeter circuit, said shield being electrically connected to a node between said circuit elements of said digital voltmeter circuit, and means supporting on said pole said digital voltmeter circuit, said digital display means and said means defining said shield.

26. A portable device of claim 9, including a non-conductive casing, said electrical shield including an electrically conductive coating provided on an inner surface of said casing, and said circuit elements each being a resistor, and said resistors having substantially equivalent resistance values.

* * * * *

UNITED STATES PATENT AND TRADEMARK OFFICE
CERTIFICATE OF CORRECTION

PATENT NO. : 5 144 227

DATED : September 1, 1992

INVENTOR(S) : Lewis A. SHAW

It is certified that error appears in the above-identified patent and that said Letters Patent is hereby corrected as shown below:

```
Column 10, line 11; change "means is ia" to
                ---means is a---.
```

Signed and Sealed this

Nineteenth Day of October, 1993

Attest:

BRUCE LEHMAN

*Attesting Officer*     *Commissioner of Patents and Trademarks*